United States Patent
Muramatsu

(10) Patent No.: US 10,234,509 B2
(45) Date of Patent: Mar. 19, 2019

(54) CONTROLLER AND ANOMALY DIAGNOSTIC DEVICE

(71) Applicant: FANUC CORPORATION, Yamanashi (JP)

(72) Inventor: Toshifumi Muramatsu, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 70 days.

(21) Appl. No.: 15/493,372

(22) Filed: Apr. 21, 2017

(65) Prior Publication Data
US 2017/0307689 A1 Oct. 26, 2017

(30) Foreign Application Priority Data
Apr. 21, 2016 (JP) .................... 2016-085073

(51) Int. Cl.
G01R 31/34 (2006.01)
G01M 13/045 (2019.01)
H02K 11/20 (2016.01)

(52) U.S. Cl.
CPC ......... G01R 31/343 (2013.01); G01M 13/045 (2013.01); H02K 11/20 (2016.01)

(58) Field of Classification Search
CPC .... G01M 13/04; G01M 13/045; G05B 23/02; H02P 6/16; G01H 1/00; G01H 1/08
See application file for complete search history.

(56) References Cited

U.S. PATENT DOCUMENTS

| | | | |
|---|---|---|---|
| 7,170,254 B2* | 1/2007 | Yamada | G01R 7/06 318/434 |
| 2006/0001392 A1* | 1/2006 | Ajima | B62D 5/046 318/432 |

FOREIGN PATENT DOCUMENTS

| | | |
|---|---|---|
| JP | H10-281859 A | 10/1998 |
| JP | 2001-124665 A | 5/2001 |
| JP | 2001-255220 A | 9/2001 |
| JP | 2002022617 A | 1/2002 |
| JP | 2006-234787 A | 9/2006 |
| JP | 2007-285874 A | 11/2007 |
| JP | 5187172 B2 | 4/2013 |
| WO | 2011/085737 A1 | 7/2011 |

* cited by examiner

Primary Examiner — Minh N Tang
(74) Attorney, Agent, or Firm — Hauptman Ham, LLP

(57) ABSTRACT

The controller is equipped with a detection signal acquiring unit adapted to acquire a detection signal from a sensor that detects a physical quantity caused by vibrations generated at a detected location due to rotation of an electric motor, a phase information acquiring unit adapted to acquire phase information of the electric motor, a time width determining unit adapted to determine a time width, which coincides with a period of a phenomena occurring at the detected location due to rotation of the electric motor, on the basis of the phase information, a signal dividing unit adapted to divide the detection signal based on the determined time width, and an adding and averaging unit adapted to add and average a plurality of divided signals divided by the time width.

14 Claims, 9 Drawing Sheets

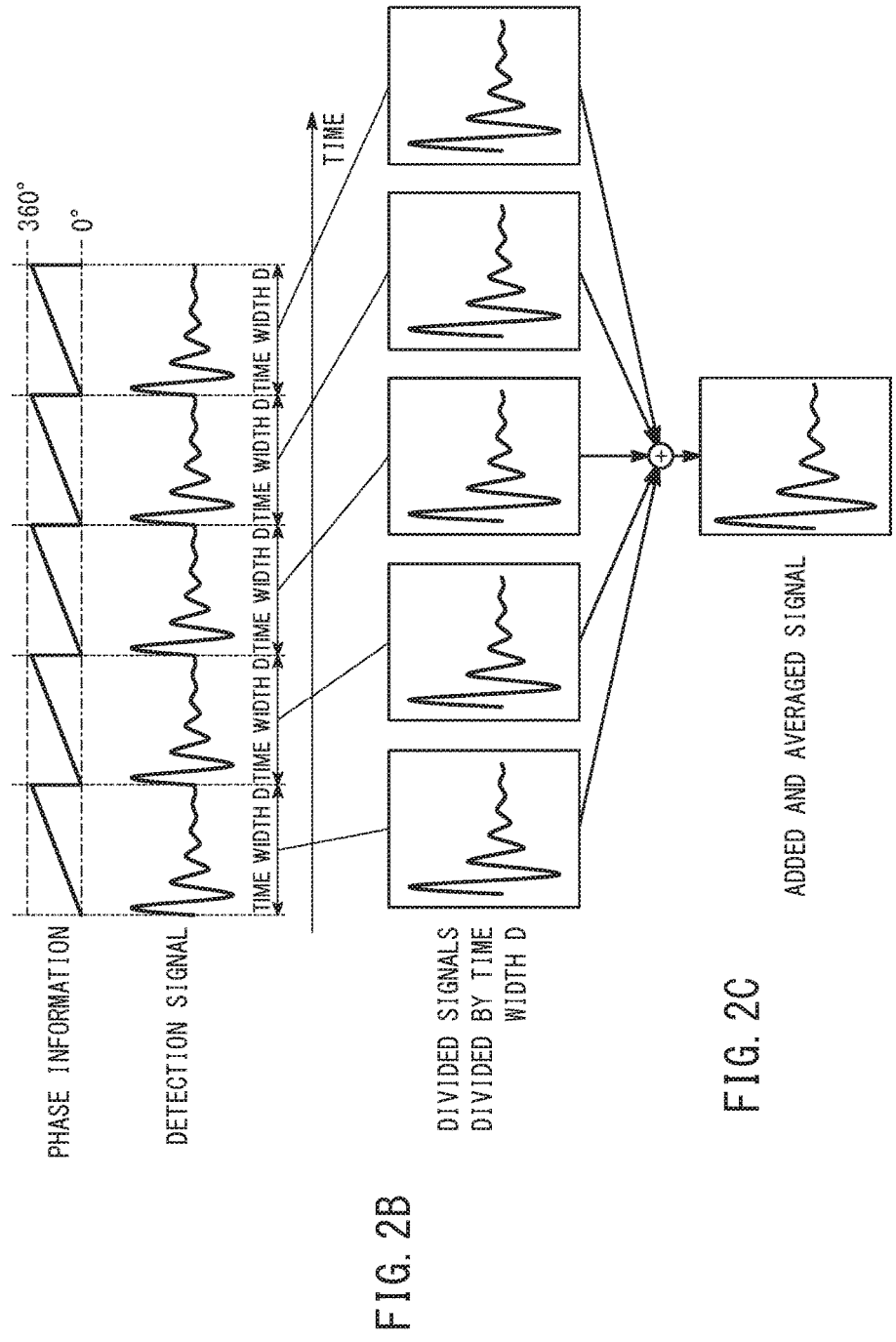

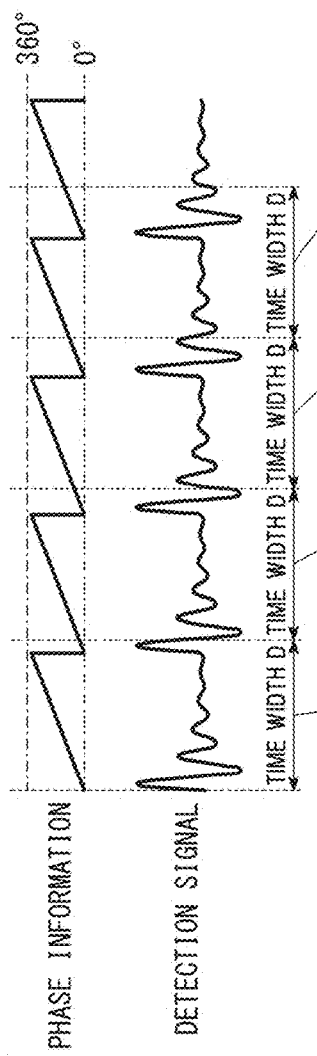
FIG. 3A (Prior Art)
FIG. 3B (Prior Art)
FIG. 3C (Prior Art)

CONTROLLER AND ANOMALY DIAGNOSTIC DEVICE

CROSS-REFERENCE TO RELATED APPLICATION

This application is based upon and claims the benefit of priority from Japanese Patent Application No. 2016-085073 filed on Apr. 21, 2016, the contents of which are incorporated herein by reference.

BACKGROUND OF THE INVENTION

Field of the Invention

The present invention relates to a controller and an anomaly diagnostic device for eliminating noise components included within a detection signal of a sensor that detects a physical quantity caused by vibrations generated due to rotation of an electric motor.

Description of the Related Art

Conventionally, it has been known to diagnose a rotating member or an anomaly of the rotating member using a detection signal obtained from a sensor that detects a physical quantity caused by vibration of the rotating member which is rotated by an electric motor or the like.

In Japanese Laid-Open Patent Publication No. 2007-285874, an anomaly diagnostic device is disclosed in which a physical quantity generated due to vibration of a rotating part of production equipment is detected, and after having performed synchronous averaging with respect to a signal on the basis of the detected physical quantity, a frequency analysis is performed in order to determine the presence or absence of an anomaly of the rotating part on the basis of frequency components thereof, and the anomalous location is specified. Further, random spike noise is added to the signal on the basis of the detected physical quantity. The spike noise serves to easily amplify the vibration of the rotating member.

SUMMARY OF THE INVENTION

In general, when diagnosing the anomaly, the obtained signal is subjected to Fourier transformation (for example, FFT) and converted into a frequency domain signal, and thereafter, an anomaly diagnosis is performed based on the converted information. In addition, prior to the Fourier transformation, in order to eliminate noise components, adding and averaging is performed with respect to the obtained signal. Such adding and averaging is implemented by dividing the signal by a certain time width, adding a plurality of the divided signals, and averaging the divided signals. Such a time width often takes the form of a fixed value, which is determined by the operating frequency of a computing unit of the device or the sampling period of the signal. For this reason, the phenomenon caused by rotation, and the time width by which the signal is divided do not necessarily coincide, and the signal becomes distorted. Thus, before performing Fourier transformation, a window function process must be carried out in order to suppress leakage that occurs as a result of a mismatch between the phenomenon due to rotation and the time width by which the signal is divided.

Further, in Japanese Laid-Open Patent Publication No. 2007-285874, although it is disclosed that a synchronous averaging process is performed prior to performing Fourier transformation, there is no disclosure concerning the time width by which the signal is divided. Consequently, according to Japanese Laid-Open Patent Publication No. 2007-285874, the phenomenon caused by rotation, and the time width by which the signal is divided do not coincide, and the signal becomes distorted. As a result, the phenomenon due to rotation cannot be grasped accurately, and an accurate anomaly diagnosis cannot be performed. Further, in order to prevent such problems, it is essential to perform the window function process.

Thus, the present invention has the object of providing a controller and an anomaly diagnostic device which, with a simple process, are capable of grasping phenomena caused by rotation, and improving the accuracy of an anomaly diagnosis.

A first aspect of the present invention is characterized by a controller, comprising a detection signal acquiring unit adapted to acquire a detection signal from a sensor that detects a physical quantity caused by vibrations generated at a detected location due to rotation of an electric motor, a phase information acquiring unit adapted to acquire phase information of the electric motor, a time width determining unit adapted to determine, on the basis of the phase information, a time width, which coincides with a period of a phenomenon occurring at the detected location due to rotation of the electric motor, a signal dividing unit adapted to divide the detection signal based on the determined time width, and an adding and averaging unit adapted to add and average a plurality of divided signals divided by the signal dividing unit.

In accordance with such a configuration, a synchronous averaging process can be performed without distorting the waveform of the original signal (a signal component in which the phenomenon occurring at the detected location is captured). Consequently, since it is unnecessary to perform a window function process prior to subjecting the added and averaged signal to Fourier transformation after the synchronous averaging process, the process as a whole can be simplified. Further, since components apart from signal components in which the phenomenon occurring at the detected location is captured are treated as noise components and eliminated, it is possible to extract only the signal components in which the phenomenon occurring at the detected location is captured. Accordingly, using the added and averaged signal, it is possible to grasp in detail the phenomenon occurring at the detected location, and to improve the accuracy of the anomaly diagnosis.

According to the first aspect of the present invention, in the controller, the period of the phenomenon occurring due to rotation of the electric motor may differ depending on the detected location, and the time width determining unit may determine the time width that coincides with the period corresponding to the detected location. In accordance with this feature, using the added and averaged signal, it is possible to grasp in detail the phenomenon occurring at the detected location, which is focused on as a target of diagnosis, and to improve the accuracy of the anomaly diagnosis.

According to the first aspect of the present invention, in the controller, even at the same detected location, the period of the phenomenon occurring due to rotation of the electric motor may differ depending on a member or component that constitutes the detected location, and the time width determining unit may determine the time width that coincides with the period corresponding to the member or component serving as a target of diagnosis. In accordance with this feature, using the added and averaged signal, within the detected location, it is possible to grasp in detail the phenomenon occurring in the member or the component, which is focused on as a target of diagnosis, and to improve the accuracy of the anomaly diagnosis.

According to the first aspect of the present invention, in the controller, the detected location may be a diagnostic location where an anomaly diagnosis is to be carried out. In accordance with this feature, the sensor is capable of detecting the physical quantity due to vibrations generated at the diagnostic location where the anomaly diagnosis is to be carried out.

According to the first aspect of the present invention, in the controller, the electric motor may be provided with a rotation detector adapted to detect a phase of the electric motor, and the phase information acquiring unit may acquire the phase information which is detected by the rotation detector. In accordance with this feature, accurate phase information of the electric motor can be acquired.

According to the first aspect of the present invention, in the controller, the phase information acquiring unit may acquire the phase information by estimating the phase information of the electric motor. In accordance with this feature, since there is no need to provide the rotation detector, costs can be reduced.

According to the first aspect of the present invention, the controller may acquire the detection signal and the phase information through at least one other controller. In accordance with this feature, by additionally introducing another controller according to the first aspect of the present invention, the anomaly diagnosis can be performed on an already existing diagnostic target mechanism, and without replacing the controller that does not have an anomaly diagnosing function.

A second aspect of the present invention is characterized by an anomaly diagnostic device, equipped with a sensor that detects a physical quantity caused by vibrations generated at a diagnostic location due to rotation of an electric motor, a phase information acquiring unit adapted to acquire phase information of the electric motor, a time width determining unit adapted to determine a time width, which coincides with a period of a phenomenon occurring at the diagnostic location due to rotation of the electric motor, on the basis of the phase information, a signal dividing unit adapted to divide the detection signal detected by the sensor based on the determined time width, and an adding and averaging unit adapted to add and average a plurality of divided signals divided by the signal dividing unit.

In accordance with such a configuration, a synchronous averaging process can be performed without distorting the waveform of the original signal (a signal component in which the phenomenon occurring at the diagnostic location is captured). Consequently, since it is unnecessary to perform a window function process prior to subjecting the added and averaged signal to Fourier transformation after the synchronous averaging process, the process as a whole can be simplified. Further, since components apart from signal components in which the phenomenon occurring at the diagnostic location is captured are treated as noise components and eliminated, it is possible to extract only the signal components in which the phenomenon occurring at the diagnostic location is captured. Accordingly, using the added and averaged signal, it is possible to grasp in detail the phenomenon occurring at the diagnostic location, and to improve the accuracy of the anomaly diagnosis.

According to the second aspect of the present invention, in the anomaly diagnostic device, the period of the phenomenon occurring due to rotation of the electric motor differs depending on the diagnostic location, and the time width determining unit may determine the time width that coincides with the period corresponding to the diagnostic location. In accordance with this feature, using the added and averaged signal, it is possible to grasp in detail the phenomenon occurring at the diagnostic location, which is focused on as a target of diagnosis, and to improve the accuracy of the anomaly diagnosis.

According to the second aspect of the present invention, in the anomaly diagnostic device, even at the same diagnostic location, the period of the phenomenon occurring due to rotation of the electric motor may differ depending on a cause of the anomaly, and the time width determining unit may determine the time width that coincides with the cause of the anomaly to be diagnosed. Accordingly, using the added and averaged signal, it is possible to grasp in detail the phenomenon caused by the anomaly to be diagnosed, and to improve the accuracy of the anomaly diagnosis.

According to the second aspect of the present invention, the anomaly diagnostic device may further comprise a rotation detector adapted to detect a phase of the electric motor, and the phase information acquiring unit may acquire the phase information which is detected by the rotation detector. In accordance with this feature, accurate phase information of the electric motor can be acquired.

According to the second aspect of the present invention, in the anomaly diagnostic device, the phase information acquiring unit may acquire the phase information by estimating the phase information of the electric motor. In accordance with this feature, since there is no need to provide the rotation detector, costs can be reduced.

According to the second aspect of the present invention, the anomaly diagnostic device may further comprise a frequency analyzing unit adapted to convert an added and averaged signal, which was added and averaged by the adding and averaging unit, into a frequency signal, and an anomaly diagnostic unit adapted to perform an anomaly diagnosis on the basis of the frequency signal. In accordance with this feature, the anomaly diagnosis can be performed.

According to the second aspect of the present invention, in the anomaly diagnostic device, the anomaly diagnostic device may acquire the detection signal and the phase information through at least one other controller. In accordance with this feature, by additionally introducing another anomaly diagnostic device to the second aspect of the present invention, the anomaly diagnosis can be performed on an already existing diagnostic target mechanism.

According to the present invention, a synchronous averaging process can be performed without distorting the waveform of the signal component in which the phenomenon occurring at the detected location (diagnostic location) is captured. Consequently, since it is unnecessary to perform a window function process prior to subjecting the added and averaged signal to Fourier transformation after the synchronous averaging process, the process as a whole can be simplified. Further, since components apart from signal components in which the phenomenon occurring at the detected location (diagnostic location) is captured are treated as noise components and eliminated, it is possible to extract only the signal components in which the phenomenon occurring at the detected location (diagnostic location) is captured. Accordingly, using the added and averaged signal, it is possible to grasp in detail the phenomenon occurring at the detected location (diagnostic location), and to improve the accuracy of the anomaly diagnosis.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 2A is a diagram showing time widths determined on the basis of phase information detected by a rotation detector;

FIG. 2B is a diagram showing a plurality of divided signals when a detection signal is divided by the time widths shown in FIG. 2A;

FIG. 2C is a diagram showing an added and averaged signal obtained by adding and averaging the plurality of divided signals shown in FIG. 2B;

FIG. 3A is a diagram showing conventional time widths determined by an operating frequency of a computing unit of the device and a sampling period of the signal;

FIG. 3B is a diagram showing a plurality of divided signals when the detection signal is divided by the time widths shown in FIG. 3A;

FIG. 3C is a diagram showing an added and averaged signal obtained by adding and averaging the plurality of divided signals shown in FIG. 3B;

DESCRIPTION OF THE PREFERRED EMBODIMENTS

Preferred embodiments in relation to a controller and an anomaly diagnostic device according to the present invention will be described in detail below with reference to the accompanying drawings.

First Embodiment

Figure 1:
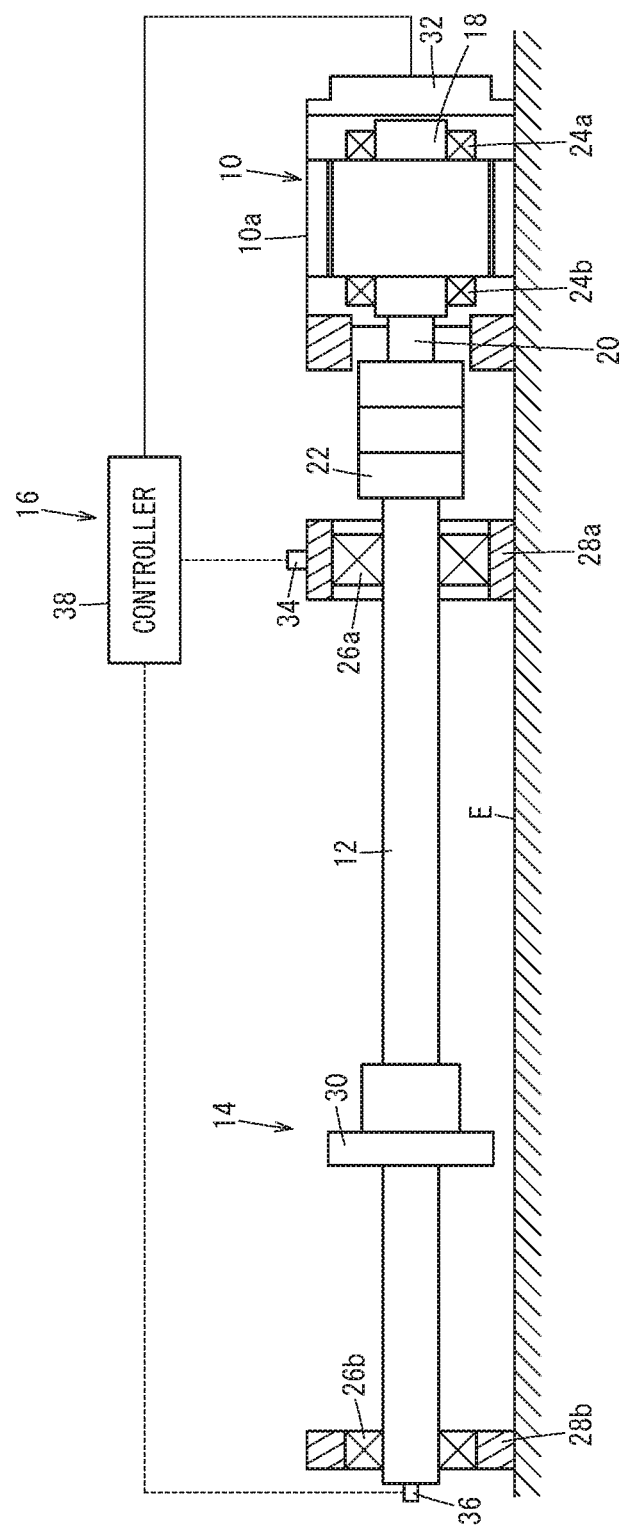
FIG. 1 is a diagram showing a feed mechanism constituting by a feed shaft in which a motor and a ball screw are used, and an anomaly diagnostic device applied to the feed mechanism, according to a first embodiment of the present invention.

FIG. 1 is a diagram showing a feed mechanism 14 constituting a feed shaft in which an electric motor (for example, a servo motor) 10 and a ball screw 12 are used, and an anomaly diagnostic device 16 applied to the feed mechanism 14, according to a first embodiment of the present invention. The ball screw (rotating member) 12 and a rotary shaft 20 connected to a rotor 18 of the electric motor 10 are connected through a coupling 22. The rotor 18 of the electric motor 10 is supported rotatably by bearings 24a, 24b. The bearings 24a, 24b are fixed to a housing 10a of the electric motor 10. The ball screw 12 is rotatably supported by a bearing 26a disposed on the side of the coupling 22, and a bearing 26b disposed on a distal end side of the ball screw 12. The bearings 26a, 26b are supported by support members 28a, 28b provided on an installation surface E on which the feed mechanism 14 is mounted. A nut 30 is screw-engaged with the ball screw 12, and the nut 30 is disposed between the bearing 26a and the bearing 26b. Upon rotation of the rotor 18 of the electric motor 10, the ball screw 12 also rotates, whereupon the nut 30 moves along the axial direction of the ball screw 12.

A rotation detector 32 such as an encoder or the like for detecting the phase (rotational position) of the electric motor 10 (more specifically, the rotor 18) is provided in the electric motor 10. On the basis of the phase information (rotational position information) of the rotor 18 (electric motor 10) as detected by the rotation detector 32, the rotational period (rotational frequency) of the rotor 18 (electric motor 10) can also be obtained. Sensors 34, 36 are attached at detected locations in order to detect physical quantities due to vibrations generated at the detected locations (also referred to as diagnostic locations) where anomalies are to be diagnosed. In the first embodiment, the sensors 34, 36 are attached to the support member 28a and to the ball screw 12. Vibrations generated at the support member 28a, the bearing 26a, and the ball screw 12 are generated as a result of rotation of the electric motor 10 (rotor 18). Stated otherwise, the support member 28a, the bearing 26a, and the ball screw 12 form the detected locations (diagnostic locations). The sensor 34 may detect vibrations of a translational component caused by rotation of the ball screw 12, and the sensor 36 may detect vibrations of a rotational component caused by the rotation of the ball screw 12.

The phase information detected by the rotation detector 32, and the detection signals detected by the sensors 34, 36 are transmitted to the controller 38. The controller 38 acquires the phase information and the detection signals either over wires or wirelessly. The rotation detector 32, the sensors 34, 36, and the controller 38 constitute the anomaly diagnostic device 16 according to the first embodiment. The controller 38 includes a computer and a storage medium in which a program is stored, and the computer functions as the controller 38 of the first embodiment by executing the program that is stored in the storage medium.

The controller 38 performs a synchronous averaging process in order to eliminate noise components included in the detection signals detected by the sensors 34, 36. More specifically, the synchronous averaging process is carried out, in which the detection signal is divided by a time width D, and a plurality of divided signals are added and averaged. The time width D is determined on the basis of the phase information of the rotor 18 as detected by the rotation detector 32.

With reference to FIGS. 2A through 2C, a concept of the synchronous averaging process of the detection signals according to the first embodiment will be described. FIG. 2A is a diagram showing time width D determined on the basis of phase information detected by the rotation detector 32, FIG. 2B is a diagram showing a plurality of signals (hereinafter referred to as divided signals) when the detection signal is divided by the determined time width D, and FIG. 2C is a diagram showing a signal (hereinafter referred to as an added and averaged signal) obtained by adding and averaging the plurality of divided signals. Although it will be described in detail later, as shown in FIG. 2A, on the basis of the phase information detected by the rotation detector 32, periodic characteristics of the physical quantities detected by the sensors 34, 36 (phenomena occurring at the detected locations due to rotation) can be understood. Consequently, by determining the time width D based on the phase information detected by the rotation detector 32 and the sampling period, the time width D, which matches the periodic characteristic of the phenomenon caused by rotation, can be determined. In the example shown in FIG. 2A, the time width D is defined by the time it takes for the rotor 18 (ball screw 12) to undergo one rotation.

Therefore, as shown in FIG. 2B, the plurality of respective divided signals, which are divided by the time width D, have a same or similar waveform mutually. In addition, as shown in FIG. 2C, by adding and averaging the plurality of divided signals, which are divided by the time width D, an added and averaged signal from which noise components are eliminated can be obtained, and the waveform of the original signal (the respective divided signals) does not become distorted by such adding and averaging. Consequently, it is unnecessary to perform a window function process prior to subjecting the added and averaged signal to Fourier transformation (for example, FFT: Fast Fourier Transformation).

In contrast thereto, as in the conventional technique, in the case that the time width D is in the form of a value determined by the operating frequency of a computing unit of the device or the sampling period of the signal, then as shown in FIG. 3A, the period of the detection signal in which the phenomenon caused by rotation is captured does not coincide with the time width D. Therefore, as shown in FIG. 3B, each of the plurality of divided signals which are divided by the time width D exhibits a different waveform, and as shown in FIG. 3C, when the plurality of divided signals are added and averaged, the waveform of the original signal becomes distorted as a result of such adding and averaging. For this reason, prior to performing Fourier transformation (for example, FFT) with respect to the added and averaged signal, it is necessary to perform a window function process in order to avoid leakage that occurs in the case of a mismatch between a starting value and an ending value of the signal.

Moreover, in the detection signals detected by the sensors 34, 36, noise components are also included therein apart from the signal components indicative of the phenomena occurring at the detected locations due to rotation of the electric motor 10 (rotor 18). Therefore, cases may occur in which the periods of the detection signals detected by the sensors 34, 36 are not the same as the period of the signal component indicative of the phenomena occurring at the detected locations. Consequently, in FIGS. 2A through 2C and FIGS. 3A through 3C, in order to facilitate understanding of the invention, only signal components indicative of the phenomenon caused by rotation are represented as the detection signal.

Figure 4:
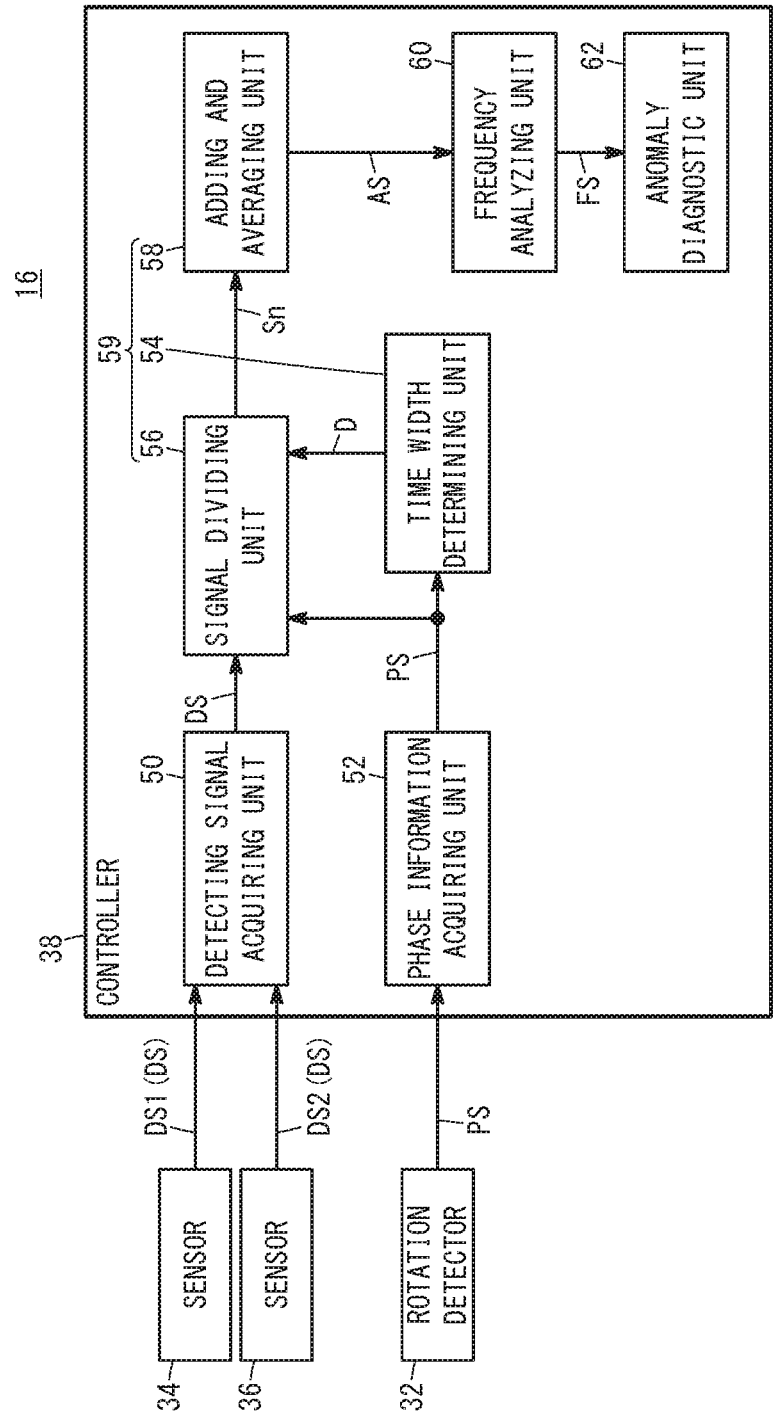
FIG. 4 is a functional block diagram of the anomaly diagnostic device shown in FIG. 1.

The anomaly diagnostic device 16 according to the first embodiment will be described in detail below. FIG. 4 is a functional block diagram of the anomaly diagnostic device 16. The controller 38 is equipped with a detection signal acquiring unit 50, a phase information acquiring unit 52, a time width determining unit 54, a signal dividing unit 56, an adding and averaging unit 58, a frequency analyzing unit 60, and an anomaly diagnostic unit 62.

The detection signal acquiring unit 50 acquires the detection signals DS (DS1, DS2) detected by the sensors 34, 36. The detection signal acquiring unit 50 outputs the acquired detection signals DS (DS1, DS2) to the signal dividing unit 56. The phase information acquiring unit 52 acquires the phase information PS of the electric motor 10 (rotor 18) detected by the rotation detector 32. By the phase information PS, the rotational period (rotational frequency) of the rotor 18 also is understood. The phase information acquiring unit 52 outputs the acquired phase information PS to the time width determining unit 54 and the signal dividing unit 56.

The time width determining unit 54 determines the time width D for dividing the detection signals DS (DS1, DS2) based on the acquired phase information PS. The time width determining unit 54 determines the time width D to coincide with the period of the phenomena occurring at the detected locations due to rotation of the electric motor 10 (rotor 18). The time width D, which coincides with the period of the phenomena occurring at the detected locations, signifies a positive number multiple (including one time) of the period of the phenomena occurring at the detected locations. The time width determining unit 54 may also determine the time width D taking into consideration the sampling period.

The periods of the phenomena occurring due to rotation of the electric motor 10 differ depending on the detected location, and therefore, the time width determining unit 54 determines time widths D that coincide with the periods corresponding to the detected locations. For this reason, the time width D corresponding to the support member 28a, the time width D corresponding to the bearing 26a, and the time width D corresponding to the ball screw 12 differ mutually from each other. Further, the periods of the phenomena occurring due to rotation of the electric motor 10, even at the same detected location, differ depending on the cause of the anomaly to be diagnosed. The causes of the anomalies differ depending on the member or component that constitutes the detected location. Therefore, the time width D is determined to coincide with the period corresponding to the cause (i.e., the member or component of the diagnostic target) of the anomaly to be diagnosed. For example, since a bearing such as the bearing 26a or the like is constituted from a plurality of members or components, in the case that the detected location serving as the diagnostic target is the bearing 26a, the time width D is determined to coincide with the period corresponding to a member or component thereof that serves as the diagnostic target.

The signal dividing unit 56 divides the detection signal DS (DS1, DS2) on the basis of the time width D determined and the detected phase information PS of the rotor 18. The signal dividing unit 56 outputs the divided plurality of divided signals Sn to the adding and averaging unit 58. The adding and averaging unit 58 adds and averages the divided plurality of divided signals Sn. The adding and averaging unit 58 outputs to the frequency analyzing unit 60 an added and averaged signal AS, which is obtained by adding and averaging the plurality of divided signals Sn. The time width determining unit 54, the signal dividing unit 56, and the adding and averaging unit 58 collectively make up a synchronous adding unit 59 according to the first embodiment of the present invention.

The frequency analyzing unit 60 analyzes the frequency of the added and averaged signal AS. Stated otherwise, the frequency analyzing unit 60 analyzes the frequency by converting the added and averaged signal from a time domain into a frequency domain. Owing thereto, the time-domain-based added and averaged signal AS is converted into a frequency-domain-based added and averaged signal (hereinafter referred to as a frequency signal) FS. The frequency analyzing unit 60 converts the time-domain-based added and averaged signal AS into the frequency signal FS, for example, using a fast Fourier transformation. The frequency analyzing unit 60 outputs the converted frequency signal FS to the anomaly diagnostic unit 62. The anomaly diagnostic unit 62 performs an anomaly diagnosis based on the frequency signal FS that was converted into a frequency domain. Stated otherwise, a diagnosis is carried out as to whether there is an anomaly in the phenomenon occurring at the detected site (diagnostic site) due to rotation of the electric motor 10 (rotor 18). Since such an anomaly diagnosis can be implemented using known technology, detailed explanation thereof is omitted.

Next, a description will be presented by way of example of a case in which a detection signal DS1 is subjected to synchronous averaging, and noise components contained within the detection signal DS1 are eliminated, in order to carry out an anomaly diagnosis using the detection signal DS1 detected by the sensor 34 provided in the support member 28a. In this instance, the frequency (period) of a phenomenon occurring due to rotation of the bearing differs depending on the specifications of the bearing, and even in the case of bearings having the same specifications, the frequency (period) at which the phenomenon appears depends on the cause of the anomaly. Thus, by determining the time width D, by which the signal is to be divided, from the bearing and the cause of the anomaly that is focused on, it is possible to diagnose what kind of anomaly is present in which bearing. Since the bearing 26a is supported by the support member 28a, using the sensor 34, it is possible to diagnose what kind of anomaly is present in the bearing 26a. Further, by determining the time width D corresponding to the support member 28a, it is possible to diagnose whether an anomaly has occurred in the support member 28a.

Generally, although not illustrated, the bearing includes an inner ring, an outer ring, and a plurality of balls (rolling bodies) disposed in a circumferential direction between the inner ring and the outer ring. An outer circumferential surface of the inner ring and an inner circumferential surface of the outer ring function as rolling surfaces in contact with the balls and on which the balls roll. The respective vibrational frequencies of the support member 28a or the members and components that make up the bearing 26a (passing vibrational frequency $f_{AR}$ of the balls with respect to the outer ring roller surface, passing vibrational frequency $f_{IR}$ of the balls with respect to the inner ring rolling surface, rotational vibratory frequency $f_W$ of the balls, and natural vibrational frequency $f_K$ of the support member 28a) can be represented by the following equations, where the rotational frequency of the rotor 18 is represented by $f_i$, the ball diameter (diameter) is represented by $D_W$, the pitch circle diameter is represented by $d_M$, the number of balls is represented by Z, and the contact angle is represented by $\alpha_0$.

$$f_{AR} = \frac{z \cdot f_i}{2}\left(1 - \frac{D_W}{d_M}\cos\alpha_0\right) \quad (1)$$

$$f_{IR} = \frac{z \cdot f_i}{2}\left(1 - \frac{D_W}{d_M}\cos\alpha_0\right) \quad (2)$$

$$f_W = \frac{f_i}{2}\left(\frac{d_M}{D_W} - \frac{D_W}{d_M}(\cos\alpha_0)^2\right) \quad (3)$$

$$f_K = \frac{f_i}{2}\left(1 - \frac{D_W}{d_M}\cos\alpha_0\right) \quad (4)$$

In addition, in the case it is desired to perform an anomaly diagnosis based on the rotational vibratory frequency $f_W$ of the balls of the bearing 26a, the time width determining unit 54 determines the time width D from the rotational vibratory frequency $f_W$, which is calculated using equation (3) above, and the phase information PS of the rotor 18 as detected by the rotation detector 32. For example, if the rotational frequency $f_i$ of the rotor 18 of the electric motor 10 is 50 Hz (=3000 times/sec), the ball diameter $D_W$ is 8 mm, the pitch circle diameter $d_M$ is 40 mm, the number of balls Z is 16, and the contact angle $\alpha_0$ is 15 degrees, then the rotational vibratory frequency $f_W$ of the balls becomes roughly 120 Hz. Accordingly, based on the phase information PS detected by the rotation detector 32, the time width determining unit 54 determines as the time width D a time period over which the rotor 18 of the electric motor 10 undergoes one hundred and twenty rotations. Consequently, each time that the rotor 18 undergoes one hundred and twenty rotations, the signal dividing unit 56 divides the detection signal DS1 by partitioning and extracting out the detection signal DS1 which is detected by the sensor 34, and then the adding and averaging unit 58 adds and averages the plurality of divided signals Sn divided by the time width D. Owing thereto, an added and averaged signal AS is obtained in which, within the detection signal DS1 that is detected, components thereof, apart from the signal components in which the phenomenon of rotational vibration of the balls due to rotation of the electric motor 10 (rotor 18) is captured, are regarded as noise components and eliminated. Stated otherwise, the added and averaged signal AS is obtained, in which there are extracted only signal components in which the phenomenon of rotational vibration of the balls, as the object of interest, is captured.

Further, in the case it is desired to perform an anomaly diagnosis based on the natural vibrational frequency $f_K$ of the support member 28a, the time width determining unit 54 determines the time width D from the natural vibrational frequency $f_K$, which is calculated using equation (4) above, and the phase information PS of the rotor 18 as detected by the rotation detector 32. If the exemplary numerical values of the terms $f_i$, $D_W$, $d_M$, Z, and $\alpha_0$ are as stated above, the natural vibrational frequency $f_K$ becomes roughly 20 Hz. Accordingly, based on the phase information PS detected by the rotation detector 32, for example, the time width determining unit 54 determines as the time width D a time period over which the rotor 18 of the electric motor 10 undergoes twenty rotations. Consequently, each time that the rotor 18 undergoes twenty rotations, the signal dividing unit 56 divides the detection signal DS1 by partitioning and extracting out the detection signal DS1 which is detected by the sensor 34, and then the adding and averaging unit 58 adds and averages the plurality of signals divided by the time width D. Owing thereto, an added and averaged signal AS is obtained in which, within the detection signal DS1 that is detected, components thereof, apart from the signal components in which the phenomenon of vibration of the support member 28a occurring due to rotation of the electric motor 10 (rotor 18) is captured, are regarded as noise components and eliminated. Stated otherwise, the added and averaged signal AS is obtained, in which there are extracted only signal components in which the phenomenon of vibration of the support member 28a, as the object of interest, is captured.

Furthermore, in the case it is desired to perform an anomaly diagnosis based on the passing vibrational frequency $f_{AR}$ of the balls with respect to the outer ring rolling surface, and the passing vibrational frequency $f_{IR}$ of the balls with respect to the inner ring rolling surface, in a similar manner, the time width determining unit 54 determines the time width D from the passing vibrational frequencies $f_{AR}$, $f_{IR}$, which are calculated using equations (1) and (2) above, and the phase information PS of the rotor 18 as detected by the rotation detector 32. The ball diameter $D_W$, the pitch circle diameter $d_M$, the number of balls Z, and the contact angle $\alpha_0$ are known values.

In this manner, by performing anomaly diagnoses using the added and averaged signal AS from which noise components are removed, it is possible to diagnose highly accurately whether or not there are anomalies in phenomena occurring in the bearing 26a and the support member 28a due to rotation of the electric motor 10, or in other words, whether the bearing 26a and the support member 28a are abnormal. Further, concerning the bearing 26a, it is possible to diagnose in detail what kind of anomaly is present therein. Moreover, the time width D can also be determined in a similar manner in the event that a sensor similar to the sensor 34 is provided on the support member 28b. As a result, it is possible to diagnose highly accurately whether there are anomalies in the support member 28b and the bearing 26b. Further, concerning the bearing 26b, it is possible to diagnose in detail and with high accuracy what kind of anomaly is present therein.

Also in the case of synchronously adding the detection signal DS2 detected by the sensor 36 disposed on the ball screw 12 and removing noise components therefrom, the time width determining unit 54 determines the time width D on the basis of the phase information PS detected by the rotation detector 32. For example, when the rotor 18 (electric motor 10) undergoes ten rotations, the pitch of the ball screw 12 is formed in such a manner that the nut 30 moves over the entire length of the stroke, and when the sampling period is a time period over which the rotor 18 undergoes ten rotations, the time width determining unit 54 determines as the time width D the time period over which the rotor 18 undergoes ten rotations. Consequently, each time that the rotor 18 undergoes ten rotations, the signal dividing unit 56 divides the detection signal DS2 by partitioning and extracting out the detection signal DS2 which is detected by the sensor 36, and then the adding and averaging unit 58 adds and averages the plurality of divided signals Sn divided by the time width D. Owing thereto, an added and averaged signal AS is obtained in which, within the detection signal DS2 that is detected, components thereof, apart from the signal components in which the phenomenon of vibration of the ball screw 12 due to rotation of the electric motor 10 (rotor 18) is captured, are regarded as noise components and eliminated. Stated otherwise, the added and averaged signal AS is obtained, in which there are extracted only signal components in which the phenomenon of vibration of the ball screw 12, as the object of interest, is captured.

In this manner, since the period of the phenomenon due to rotation differs depending on the detected location where the anomaly is to be diagnosed, the time width D is determined corresponding to the detected location where the anomaly is to be diagnosed. Further, even at the same detected position, since the period of the phenomenon differs depending on the cause of the anomaly to be diagnosed, the time width D is determined corresponding to the detected position to be diagnosed and the cause of the anomaly to be diagnosed. Consequently, it is possible to diagnose the anomaly in detail with high accuracy.

The electric motor 10 includes a magnet and a coil, and the controller supplies a driving current to the coil of the electric motor 10, whereby rotation of the rotor 18 is driven and controlled. The controller that controls driving of the electric motor 10 (rotor 18) may be the controller 38, or may be a non-illustrated dedicated controller which is dedicated to the electric motor 10.

Second Embodiment

Figure 5:
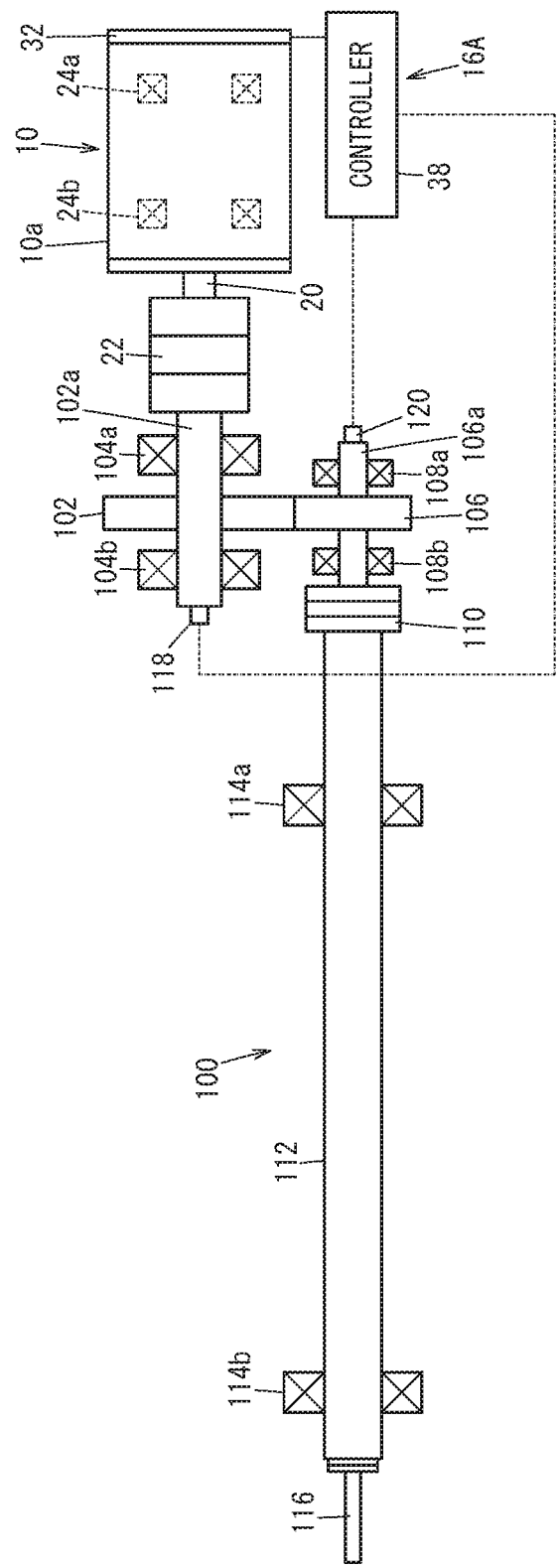
FIG. 5 is a diagram showing a drive mechanism, and an anomaly diagnostic device applied to the drive mechanism, according to a second embodiment of the present invention.

According to a second embodiment, the anomaly diagnostic device 16 described in the first embodiment is applied to the drive mechanism 100 that drives a main shaft using the electric motor 10 and a gear. FIG. 5 is a diagram showing the drive mechanism 100, and an anomaly diagnostic device 16A applied to the drive mechanism 100, according to the second embodiment of the present invention. Constituent elements which are the same as those of the above-described first embodiment are denoted by the same reference numerals, and description of such features is omitted.

A rotary shaft 102a of a drive gear (rotating member) 102 is connected through a coupling 22 to the rotary shaft 20 that is connected to the rotor 18 (illustration omitted) of the electric motor 10. The rotary shaft 102a is supported rotatably by bearings 104a, 104b. A driven gear 106 is disposed in meshing relation with the drive gear 102. A rotary shaft 106a of the driven gear 106 is supported rotatably by bearings 108a, 108b. Owing thereto, rotation of the drive gear 102 can be transmitted to the driven gear 106. The number of teeth of the drive gear 102 is represented by M, and the number of teeth of the driven gear 106 is represented by N. In the same manner as in the above-described first embodiment, the rotor 18 is supported rotatably by the bearings 24a, 24b.

A main shaft (rotating member) 112 is connected through a coupling 110 to the rotary shaft 106a of the driven gear 106, and the main shaft 112 is supported rotatably by bearings 114a, 114b. A tool 116 is attached to a distal end of the main shaft 112. Consequently, when the rotor 18 of the electric motor 10 is rotated, the rotational force thereof is transmitted to the tool 116 through the drive gear 102, the driven gear 106, and the main shaft 112. As a result, it is possible to perform machining by the tool 116. Since the rotation of the rotor 18 is transmitted to the main shaft 112 through the drive gear 102 and the driven gear 106, the rotational speed and torque of the main shaft 112 become a rotational speed and torque corresponding to a speed reduction ratio (including a speed increasing ratio) N/M. Stated otherwise, the rotational speed of the main shaft 112 is defined by the equation, Rotational Speed f2 of Main Shaft 112=(Speed Reduction Ratio)$^{-1}$×(Rotational Speed f1 of Rotor 18), and the torque of the main shaft 112 is defined by the equation, Torque τ2 of Main Shaft 112=(Speed Reduction Ratio)×(Torque τ1 of Rotor 18).

Although not illustrated, the respective bearings 104a, 104b, 108a, 108b, and 114a, 114b are supported by a plurality of support members provided on the installation surface E on which the drive mechanism 100 is mounted.

As described above, the rotation detector 32 for detecting the phase (rotational position) of the rotor 18 is provided in the electric motor 10. Sensors 118, 120 are attached at detected locations in order to detect physical quantities due to vibrations generated at the detected locations (diagnostic locations) where anomalies are to be diagnosed. According to the second embodiment, the sensors 118, 120 are attached respectively to the rotary shaft 102a of the drive gear 102, and to the rotary shaft 106a of the driven gear 106. Vibrations generated in the rotary shafts 102a, 106a are generated as a result of rotation of the electric motor 10 (rotor 18). The sensors 118, 120 may detect vibrations of translational components caused by rotation, or may detect vibrations of rotational components. The phase information PS detected by the rotation detector 32, and the detection signals DS (DS3, DS4) detected by the sensors 118, 120 are transmitted to the controller 38. The rotation detector 32, the sensors 118, 120, and the controller 38 constitute the anomaly diagnostic device 16A according to the second embodiment.

Moreover, the controller 38 includes the same configuration as that of the above-described first embodiment, and is equipped with a detection signal acquiring unit 50, a phase information acquiring unit 52, a time width determining unit 54, a signal dividing unit 56, an adding and averaging unit 58, a frequency analyzing unit 60, and an anomaly diagnostic unit 62. In addition, the detection signals DS (DS3, DS4) detected by the sensors 118, 120 are output to the detection signal acquiring unit 50, and the phase information PS of the electric motor 10 (rotor 18) detected by the rotation detector 32 is output to the phase information acquiring unit 52.

Next, a description will be presented by way of example of a case in which a detection signal DS3 is subjected to synchronous averaging, and noise components contained within the detection signal DS3 are eliminated, in order to carry out an anomaly diagnosis using the detection signal DS3 detected by the sensor 118 attached to the rotary shaft 102a of the drive gear 102. The rotary shaft 102a of the drive gear 102 and the rotor 18 of the electric motor 10 are directly connected to each other, and therefore, the time width determining unit 54 determines as the time width D the time period over which the rotor 18 undergoes one rotation. Consequently, each time that the rotor 18 undergoes one rotation, the signal dividing unit 56 divides the detection signal DS3 by partitioning and extracting out the detection signal DS3 which is detected by the sensor 118, and then the adding and averaging unit 58 adds and averages the plurality of divided signals Sn divided by the time width D. Owing thereto, an added and averaged signal AS is obtained in which, within the detection signal DS3 that is detected, components thereof, apart from the signal components in which the phenomenon of vibration of the drive gear 102 due to rotation of the electric motor 10 (rotor 18) is captured, are regarded as noise components and eliminated. Stated otherwise, the added and averaged signal AS is obtained, in which there are extracted only signal components in which the phenomenon of vibration of the drive gear 102, as the object of interest, is captured.

Further, also in the case of synchronously averaging the detection signal DS4 detected by the sensor 118 attached to the rotary shaft 106a of the driven gear 106 and removing noise components therefrom, the time width determining unit 54 determines the time width D on the basis of the phase information PS detected by the rotation detector 32. Because the rotation of the rotor 18 of the electric motor 10 is transmitted to the driven gear 106 through the drive gear 102, from the speed reduction ratio N/M, the time width determining unit 54 determines as the time width D the time period over which the rotor 18 undergoes N/M rotations. Consequently, each time that the rotor 18 undergoes N/M rotations, the signal dividing unit 56 divides the detection signal DS4 by partitioning and extracting out the detection signal DS4 which is detected by the sensor 120, and then the adding and averaging unit 58 adds and averages the plurality of divided signals Sn divided by the time width D. Owing thereto, an added and averaged signal AS is obtained in which, within the detection signal DS4 that is detected, components thereof, apart from the signal components in which the phenomenon of vibration of the driven gear 106 due to rotation of the electric motor 10 (rotor 18) is captured, are regarded as noise components and eliminated. Stated otherwise, the added and averaged signal AS is obtained, in which there are extracted only signal components in which the phenomenon of vibration of the driven gear 106, as the object of interest, is captured.

In this manner, since the period of the phenomenon due to rotation differs depending on the detected location where the anomaly is to be diagnosed, the time width D is determined corresponding to the detected location where the anomaly is to be diagnosed.

In relation to the second embodiment, a case has been described in which the gears are of one stage, that is, a case of one drive gear 102 and one driven gear 106 that meshes with the drive gear 102. However, similarly for a case in which the gears are arranged in multiple stages, the time width determining unit 54 may determine the time width D while taking into consideration the speed reduction ratio. Further, as in the above-described first embodiment, by disposing sensors in the bearings (for example 114a, 114b), it is possible to diagnose anomalies in the bearings.

Modified Examples of First and Second Embodiments

The above-described first and second embodiments can be modified in the following manner.

Modified Example 1

According to Modified Example 1, based on the phase information PS of the rotor 18 detected by the rotation detector 32, the drive current supplied to the electric motor 10 may be changed, so as to correct minute fluctuations of the rotor 18 of the electric motor 10. Supply of the drive current to the electric motor 10 may be carried out by a non-illustrated dedicated controller which is dedicated to the electric motor 10, or may be carried out by the controller 38.

Modified Example 2

Although descriptions have been presented of examples in which the feed mechanism 14 and the drive mechanism 100 serve as mechanisms to which the anomaly diagnostic devices 16, 16A are applied, the present invention is not limited to such mechanisms. For example, even in the case that a pulley is connected, the time width D may be determined using a speed reduction ratio (including a speed increasing ratio) made up by the pulley. Apart therefrom, the same features may be applied to a slide speed reducer constituted by balls, a driving disk, and a driven disk.

Modified Example 3

Figure 6:
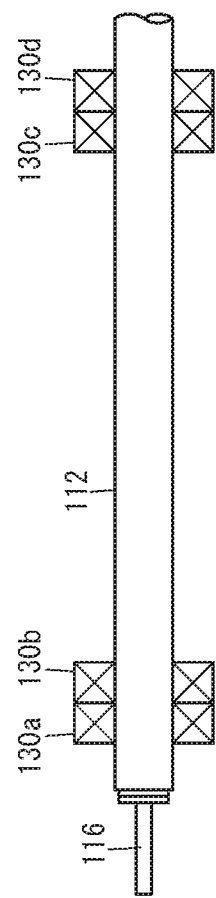
FIG. 6 is a diagram for describing a modified example 3 of the first and second embodiments.

Although in each of the above-described embodiments, examples have been indicated in which only one row of bearings is used at each of respective positions, as shown in FIG. 6, multiple rows of bearings may be used at each of the positions. In FIG. 6, bearings 130a, 130b are provided at a position on a distal end side of the main shaft 112, whereas bearings 130c, 130d are provided at a position on a rear end side of the main shaft 112. In this case, although it is impossible to completely specify the bearing in which the anomaly is present, it is possible to judge at which position the anomaly of the bearings occurs, and therefore, the modified example is useful as an anomaly diagnostic technique. With the example shown in FIG. 6, it is possible to diagnose whether or not an anomaly is present in the bearings 130a, 130b positioned on the distal end side, and whether or not an anomaly is present in the bearings 130c, 130d positioned on the rear end side.

Modified Example 4

Although the rotation detector 32 is provided for the purpose of acquiring the phase information PS, the rotation detector 32 need not necessarily be provided. In this case, the phase information acquiring unit 52 acquires the phase information PS by estimating the phase information PS of the electric motor 10 (rotor 18). Since estimation of the phase information PS of the electric motor 10 (rotor 18) can be implemented using known technology, detailed explanation thereof is omitted.

Modified Example 5

The sensors 34, 36 are provided for the purpose of acquiring the physical quantity, however, any number of sensors may be provided. The number of sensors can be freely determined depending on the object for which the anomaly is to be diagnosed.

Modified Example 6

In the above-described first and second embodiment, examples have been shown in which the embodiments are applied to an anomaly diagnosis. However, the present invention can also be applied to controlling the electric motor 10. When a synchronous motor rotates, an uneven feed occurs due to the structure of the electric motor. Such an uneven feed differs depending on the individual motors, such that variations are exhibited in the drive current flowing during driving of the electric motor. Thus, by acquiring a waveform of the drive current (hereinafter referred to as a current waveform), and dividing the current waveform for each revolution of the electric motor based on the phase information detected by the rotation detector, and then performing the aforementioned addition and averaging, a highly precise current waveform including an irregular feed characteristic therein can be obtained. Thereafter, based on the current waveform, the motor can be rotated smoothly, by correcting the drive current so as to cancel out the irregular feed inherent in the individual electric motors.

Modified Example 7

Modified Examples 1 through 6 may be suitably combined within a range in which no technical inconsistencies result.

Third Embodiment

Figure 7:
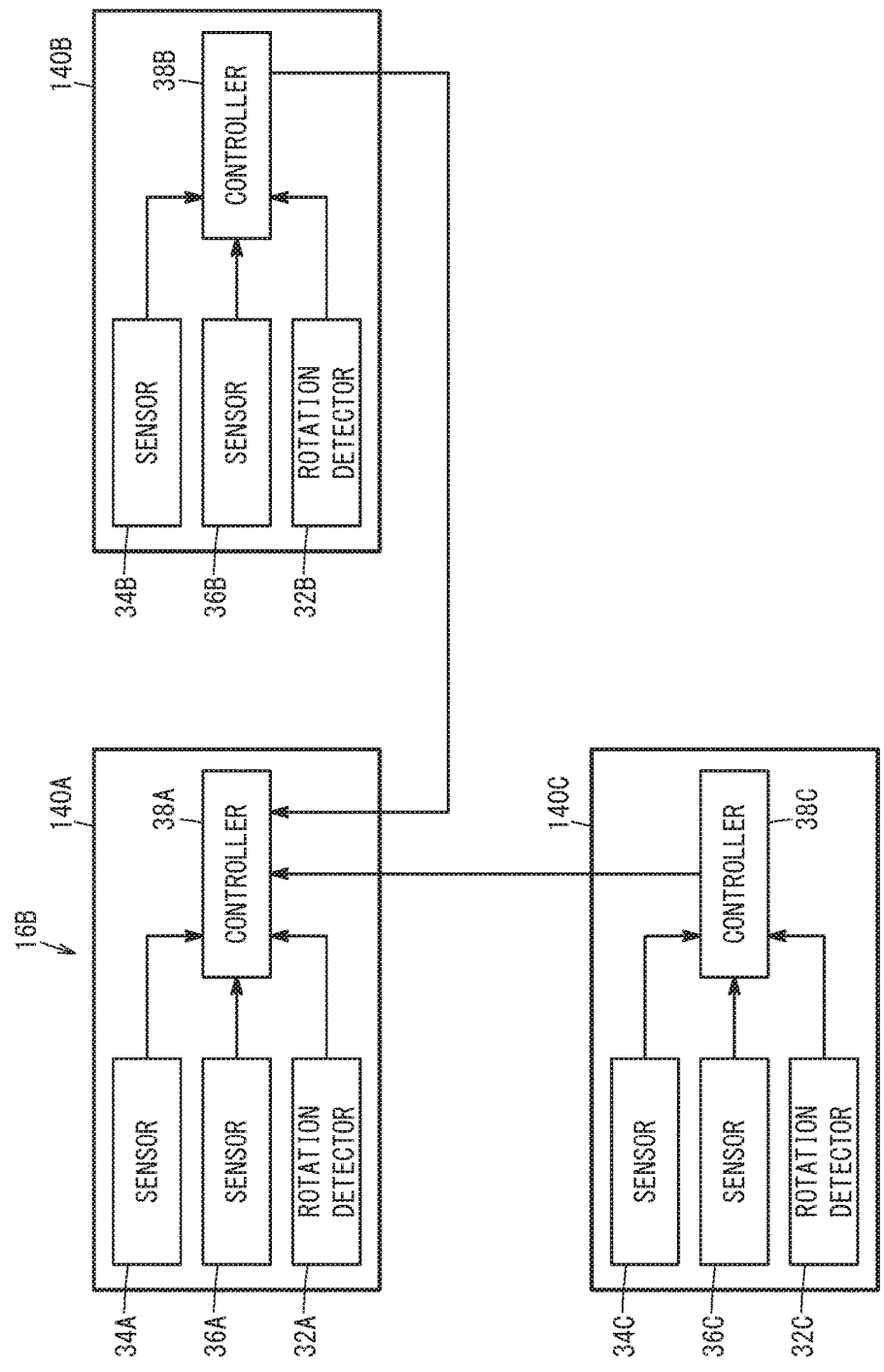
FIG. 7 is a diagram showing the configuration of an anomaly diagnostic device according to a third embodiment.

FIG. 7 is a diagram showing the configuration of an anomaly diagnostic device 16B according to a third embodiment. In the third embodiment, a plurality of different controllers 38A to 38C are provided, and respective sensors 34A to 34C, 36A to 36C and rotation detectors 32A to 32C of the plurality of different controllers 38A to 38C are connected thereto. The sensors 34A, 36A and the rotation detector 32A, the sensors 34B, 36B and the rotation detector 32B, and the sensors 34C, 36C and the rotation detector 32C are disposed in mutually different diagnostic target mechanisms (for example, the feed mechanism 14, etc.). In the present description, the diagnostic target mechanism corresponding to the controller 38A, the sensors 34A, 36A, and the rotation detector 32A is denoted by 140A, the diagnostic target mechanism corresponding to the controller 38B, the sensors 34B, 36B, and the rotation detector 32B is denoted by 140B, and the diagnostic target mechanism corresponding to the controller 38C, the sensors 34C, 36C, and the rotation detector 32C is denoted by 140C.

In the plurality of different controllers 38A to 38C, one of the controllers 38A collects signals from the other controllers 38B, 38C, and carries out a diagnosis thereon. Each of the respective controllers 38A to 38C collects signals (detection signals DS and phase information PS) from its own sensors 34A to 34C, 36A to 36C and rotation detectors 32A to 32C that are connected thereto. At this time, the controllers 38B, 38C do not perform diagnoses of anomalies on their own, but rather transmit their acquired signals (detection signals DS and phase information PS) to the controller 38A. The controller 38A carries out a diagnosis of an anomaly of the diagnostic target mechanism 140A, which is its own diagnostic target, by the signals acquired from the sensors 34A, 36A and the rotation detector 32A connected to itself, and together therewith, based on the signals acquired from the controllers 38B, 38C, carries out diagnoses of anomalies of the diagnostic target mechanisms 140B, 140C corresponding to the controllers 38B, 38C.

In this manner, only the controller 38A has an anomaly diagnostic function, and it is not necessary for the controllers 38B, 38C to possess an anomaly diagnostic function. Therefore, for example, in the case that although there is no anomaly diagnostic function in the existing controllers 38B, 38C, signals therefrom can be externally output, by introducing such signals to the controller 38A having the anomaly diagnostic function, anomaly diagnoses can be performed with respect to the diagnostic target mechanisms 140B, 140C, and without replacing the controllers 38B, 38C that do not have an anomaly diagnostic function. Moreover, the rotation detectors 32A to 32C, the sensors 34A to 34C, 36A to 36C, and the controller 38A collectively function as the anomaly diagnostic device 16B according to the third embodiment.

Modified Example 1

In the above-described third embodiment, an example has been shown in which the anomaly diagnosis is performed with signals collected from the sensors 34A to 34C, 36A to 36C and the rotation detectors 32A to 32C. However, a control for correcting driving of the electric motor 10 may be performed by the rotation detectors 32A to 32C together with other information (for example, the drive current for driving the electric motor 10).

Modified Example 2

In the above-described third embodiment, an example was shown in which the anomaly diagnosis is performed with respect to each of individual controllers. However, it is also possible to record beforehand the signals of the sensors 34A to 34C, 36A to 36C and the signals of the rotation detectors 32A to 32C of the respective controllers 38A to 38C, together with change points such as for replacement of components or the like, and by comparing the signals in the controllers 38A to 38C, the timing at which the change points such as for replacement of components or the like will occur may be estimated, and arrangement of the replacement components may be performed in advance.

Modified Example 3

According to the third embodiment, an example was shown in which all of the controllers 38A to 38C include the sensors 34A to 34C, 36A to 36C and the rotation detectors 32A to 32C. However, only one of the controllers 38A may include the sensors 34A, 36A and the rotation detector 32A, whereas the controllers 38B, 38C may include only the rotation detectors 32B, 32C. In this case, the controller 38A that includes the sensors 34A, 36A registers beforehand an integrated value of the signals from the sensors 34A, 36A and the signal from the rotation detector 32A together with a change point such as for replacement of components or the like. This signal is compared with integrated values of signals from the rotation detectors 32B, 32C of the controllers 38B, 38C including only the other rotation detectors 32B, 32C, and a timing is estimated at which change points such as for replacement of components or the like will occur, whereby arrangement of replacement components or the like may be performed.

Fourth Embodiment

Figure 8:
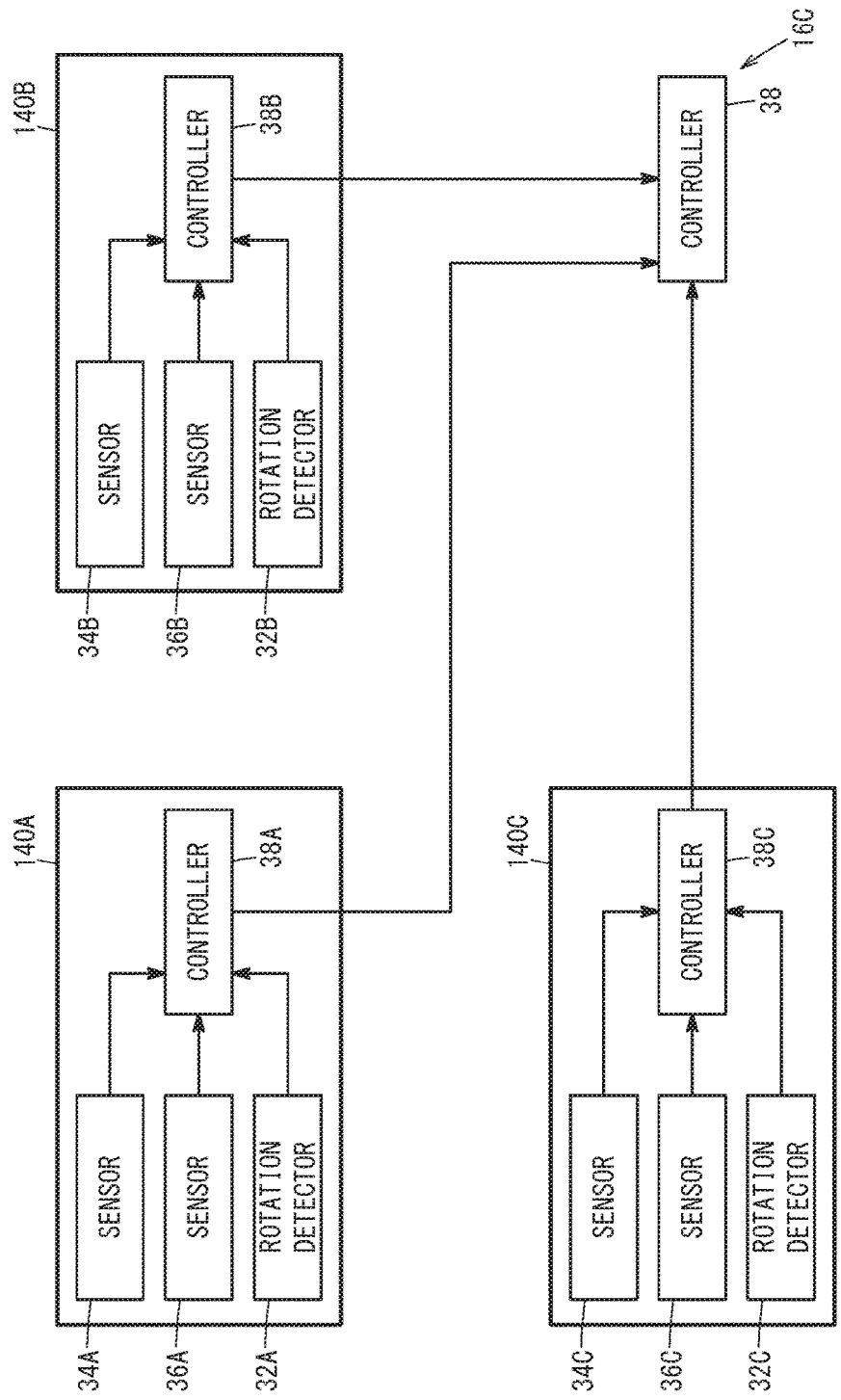
FIG. 8 is a diagram showing the configuration of an anomaly diagnostic device according to a fourth embodiment.

FIG. 8 is a diagram showing the configuration of an anomaly diagnostic device 16C according to a fourth embodiment. Constituent elements thereof which are the same as those of the above-described third embodiment are denoted by the same reference numerals. In the fourth embodiment, in addition to the controllers 38A to 38C, another controller 38 is provided that carries out an anomaly diagnosis. The controller 38 collects signals (detection signals DS and phase information PS) from the controllers 38A to 38C, and performs an anomaly diagnosis thereon. Each of the controllers 38A to 38C is connected respectively to the sensors 34A to 34C, 36A to 36C and the rotation detectors 32A to 32C, and collects signals (detection signals DS and phase information PS) therefrom. At this time, the controllers 38A to 38C transmit their acquired signals to the controller 38, without performing anomaly diagnoses on the diagnostic target mechanisms 140A to 140C that serve as their own diagnostic targets. On the basis of the signals acquired from the controllers 38A to 38C, the controller 38 carries out diagnoses of anomalies of the diagnostic target mechanisms 140A to 140C corresponding to the controllers 38A to 38C.

By this feature, since there is no need for the controllers 38A to 38C to possess the anomaly diagnostic function, in the case that there is no anomaly diagnostic function in the existing controllers but signals therefrom can be externally output, by introducing such signals to the controller 38 having the anomaly diagnostic function, anomaly diagnoses can be performed with respect to the diagnostic target mechanisms 140A to 140C, and without replacing the controllers 38A to 38C that do not have the anomaly diagnostic function. Moreover, the rotation detectors 32A to 32C, the sensors 34A to 34C, 36A to 36C, and the controller 38 collectively function as the anomaly diagnostic device 16C according to the fourth embodiment.

Modified Example 1

Figure 9:
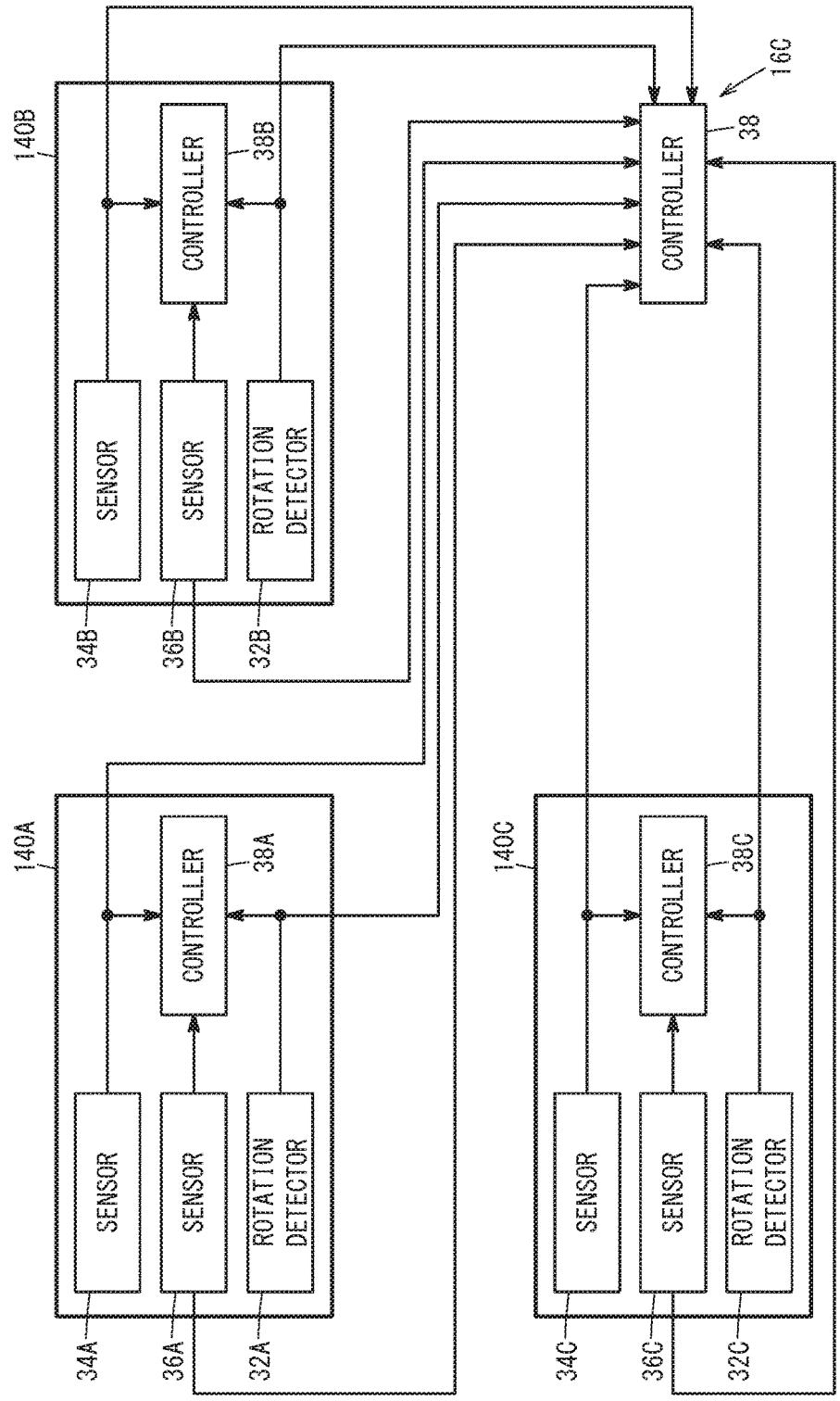
FIG. 9 is a diagram showing the configuration of an anomaly diagnostic device according to a modified example 1 of the fourth embodiment.

With the above-described fourth embodiment, an example was presented in which the controller 38A to 38C collect signals (detection signals DS and phase information PS) from the sensors 34A to 34C, 36A to 36C and the rotation detectors 32A to 32C, and output such signals to the exterior (controller 38). However, as shown in FIG. 9, the controller 38 may obtain the signals directly from the sensors 34A to 34C, 36A to 36C and the rotation detectors 32A to 32C.

Modified Example 2

Similar to the third embodiment, by recording beforehand the signals of the respective controllers together with change points such as for replacement of components or the like, and comparing the signals in the controllers, the timing at which the change points such as for replacement of components or the like will occur may be estimated, and arrangement of the replacement components may be performed in advance.

In the foregoing manner, the controllers 38, 38A according to at least one of the aforementioned respective embodiments and the respective modified examples are equipped with the detection signal acquiring unit 50 adapted to acquire the detection signal DS from a sensor that detects a physical quantity caused by vibrations generated at a detected location due to rotation of the electric motor 10, the phase information acquiring unit 52 adapted to acquire phase information PS of the electric motor 10 (rotor 18), the time width determining unit 54 adapted to determine, on the basis of the phase information PS, a time width D, which coincides with a period of a phenomenon occurring at the detected location due to rotation of the electric motor 10, the signal dividing unit 56 adapted to divide the detection signal DS based on the determined time width D, and the adding and averaging unit 58 adapted to add and average the plurality of divided signals Sn by the time width D.

In accordance therewith, the synchronous averaging process can be performed without distorting the waveform of the original signal (a signal component in which the phenomenon occurring at the detected location is captured). Consequently, since it is unnecessary to perform a window function process prior to subjecting the added and averaged signal AS to Fourier transformation after the synchronous averaging process, the process as a whole can be simplified. Further, since components apart from signal components in which the phenomenon occurring at the detected location is captured are treated as noise components and eliminated, it is possible to extract only the signal components in which the phenomenon occurring at the detected location is captured. Accordingly, using the added and averaged signal AS, it is possible to grasp in detail the phenomenon occurring at the detected location, and to improve the accuracy of the anomaly diagnosis.

The period of the phenomenon occurring due to rotation of the electric motor 10 differs depending on the detected location, and the time width determining unit 54 determines the time width D that coincides with the period corresponding to the detected location. In accordance with this feature, using the added and averaged signal AS, it is possible to grasp in detail the phenomenon occurring at the detected location, which is focused on as a target of diagnosis, and to improve the accuracy of the anomaly diagnosis.

Even at the same detected location, the period of the phenomenon occurring due to rotation of the electric motor 10 differs depending on a member or component that constitutes the detected location, and the time width determining unit 54 determines the time width D that coincides with the period corresponding to the member or component (in other words, the cause of the anomaly to be diagnosed) serving as the target of diagnosis. In accordance with this feature, using the added and averaged signal AS, within the detected location, it is possible to grasp in detail the phenomenon occurring in the member or the component, which is focused on as a target of diagnosis, and to improve the accuracy of the anomaly diagnosis.

The electric motor 10 may be provided with a rotation detector 32, 32A to 32C adapted to detect a phase of the electric motor 10 (rotor 18), and the phase information acquiring unit 52 may acquire the phase information PS which is detected by the rotation detector 32, 32A to 32C. In accordance with this feature, accurate phase information PS of the electric motor 10 (rotor 18) can be acquired.

Further, the phase information acquiring unit 52 may acquire the phase information PS by estimating the phase information PS of the electric motor 10 (rotor 18). In accordance with this feature, since there is no need to provide the rotation detector 32, 32A to 32C, costs can be reduced.

Further, the anomaly diagnostic device 16, 16A to 16C is equipped with a sensor that detects a physical quantity caused by vibrations generated at a diagnostic location due to rotation of the electric motor 10, a phase information acquiring unit 52 adapted to acquire phase information PS of the electric motor 10 (rotor 18), the time width determining unit 54 adapted to determine, on the basis of the phase information PS, the time width D, which coincides with a period of a phenomenon occurring at the diagnostic location due to rotation of the electric motor 10, the signal dividing unit 56 adapted to divide the detection signal DS detected by the sensor based on the determined time width D, and the adding and averaging unit 58 adapted to add and average a plurality of divided signals Sn divided by the time width D.

In accordance therewith, the synchronous averaging process can be performed without distorting the waveform of the original signal (a signal component in which the phenomenon occurring at the diagnostic location is captured). Consequently, since it is unnecessary to perform a window function process prior to subjecting the added and averaged signal AS to Fourier transformation after the synchronous averaging process, the process as a whole can be simplified. Further, since components apart from signal components in which the phenomenon occurring at the diagnostic location is captured are treated as noise components and eliminated, it is possible to extract only the signal components in which the phenomenon occurring at the diagnostic location is captured. Accordingly, using the added and averaged signal AS, it is possible to grasp in detail the phenomenon occurring at the diagnostic location, and to improve the accuracy of the anomaly diagnosis.

While the invention has been particularly shown and described with a reference to a preferred embodiment, it will be understood that variations and modifications can be effected thereto by those skilled in the art without departing from the scope of the invention as defined by the appended claims.

What is claimed is:

1. A controller comprising:
  a detection signal acquiring unit adapted to acquire a detection signal from a sensor that detects a physical quantity caused by vibrations generated at a detected location due to rotation of an electric motor;
  a phase information acquiring unit adapted to acquire phase information of the electric motor;
  a time width determining unit adapted to determine, on basis of the phase information, a time width, which coincides with a period of a phenomenon occurring at the detected location due to rotation of the electric motor;
  a signal dividing unit adapted to divide the detection signal based on the determined time width; and
  an adding and averaging unit adapted to add and average a plurality of divided signals divided by the signal dividing unit.

2. The controller according to claim 1, wherein:
  the period of the phenomenon occurring due to rotation of the electric motor differs depending on the detected location; and
  the time width determining unit determines the time width that coincides with the period corresponding to the detected location.

3. The controller according to claim 2, wherein:
  even at the same detected location, the period of the phenomenon occurring due to rotation of the electric motor differs depending on a member or component that constitutes the detected location; and
  the time width determining unit determines the time width that coincides with the period corresponding to the member or component serving as a target of diagnosis.

4. The controller according to claim 1, wherein the detected location is a diagnostic location where an anomaly diagnosis is to be carried out.

5. The controller according to claim 1, wherein:
  the electric motor is provided with a rotation detector adapted to detect a phase of the electric motor; and
  the phase information acquiring unit acquires the phase information which is detected by the rotation detector.

6. The controller according to claim 1, wherein the phase information acquiring unit acquires the phase information by estimating the phase information of the electric motor.

7. The controller according to claim 1, wherein the controller acquires the detection signal and the phase information through at least one other controller.

8. An anomaly diagnostic device comprising:
  a sensor that detects a physical quantity caused by vibrations generated at a diagnostic location due to rotation of an electric motor;
  a phase information acquiring unit adapted to acquire phase information of the electric motor;
  a time width determining unit adapted to determine, on basis of the phase information, a time width, which coincides with a period of a phenomenon occurring at the diagnostic location due to rotation of the electric motor;
  a signal dividing unit adapted to divide the detection signal detected by the sensor based on the determined time width; and
  an adding and averaging unit adapted to add and average a plurality of divided signals divided by the signal dividing unit.

9. The anomaly diagnostic device according to claim 8, wherein:
  the period of the phenomenon occurring due to rotation of the electric motor differs depending on the diagnostic location; and
  the time width determining unit determines the time width that coincides with the period corresponding to the diagnostic location.

10. The anomaly diagnostic device according to claim 9, wherein:
  even at the same diagnostic location, the period of the phenomenon occurring due to rotation of the electric motor differs depending on a cause of the anomaly; and
  the time width determining unit determines the time width that coincides with the cause of the anomaly to be diagnosed.

11. The anomaly diagnostic device according to claim 8, further comprising:
  a rotation detector adapted to detect a phase of the electric motor;
  wherein the phase information acquiring unit acquires the phase information which is detected by the rotation detector.

12. The anomaly diagnostic device according to claim 8, wherein the phase information acquiring unit acquires the phase information by estimating the phase information of the electric motor.

13. The anomaly diagnostic device according to claim 8, further comprising:
- a frequency analyzing unit adapted to convert an added and averaged signal, which was added and averaged by the adding and averaging unit, into a frequency signal; and
- an anomaly diagnostic unit adapted to perform an anomaly diagnosis on basis of the frequency signal.

14. The anomaly diagnostic device according to claim 8, wherein the anomaly diagnostic device acquires the detection signal and the phase information through at least one other controller.

* * * * *